(12) United States Patent
Tailor

(10) Patent No.: US 12,191,361 B2
(45) Date of Patent: Jan. 7, 2025

(54) TRANSISTOR STRUCTURE WITH MULTI-LAYER FIELD PLATE AND RELATED METHOD

(71) Applicant: GlobalFoundries U.S. Inc., Malta, NY (US)

(72) Inventor: Ketankumar Harishbhai Tailor, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 349 days.

(21) Appl. No.: 17/656,277

(22) Filed: Mar. 24, 2022

(65) Prior Publication Data
US 2023/0307508 A1    Sep. 28, 2023

(51) Int. Cl.
| | |
|---|---|
| H01L 29/40 | (2006.01) |
| H01L 27/092 | (2006.01) |
| H01L 29/06 | (2006.01) |
| H01L 29/08 | (2006.01) |
| H01L 29/78 | (2006.01) |
| H10B 69/00 | (2023.01) |

(52) U.S. Cl.
CPC .......... H01L 29/404 (2013.01); H01L 27/092 (2013.01); H01L 29/0696 (2013.01); H01L 29/0847 (2013.01); H01L 29/7835 (2013.01); H10B 69/00 (2023.02)

(58) Field of Classification Search
CPC . H01L 29/404; H01L 27/092; H01L 29/0696; H01L 29/0847; H01L 29/7835; H01L 21/823418; H01L 21/823462; H01L 27/0922; H01L 27/088; H01L 29/78; H01L 29/1054; H01L 29/40114; H01L 29/402; H01L 29/42328; H01L 29/42368; H01L 29/6656; H01L 29/66651; H01L 29/66659; H01L 29/7843; H01L 29/7881; H10B 69/00
USPC ........................................................ 257/103
See application file for complete search history.

(56) References Cited

U.S. PATENT DOCUMENTS

| | | |
|---|---|---|
| 7,405,443 B1 | 7/2008 | Zuniga et al. |
| 7,462,906 B2 | 12/2008 | Lu et al. |
| 8,541,848 B2 | 9/2013 | Huang et al. |
| 8,790,966 B2 | 7/2014 | Zhang et al. |
| 8,963,241 B1 | 2/2015 | Khemka et al. |

(Continued)

FOREIGN PATENT DOCUMENTS

CN    111092123 A    5/2020

OTHER PUBLICATIONS

U.S. Appl. No. 17/029,446 Non-Final Office Action dated Dec. 13, 2021, 15 pages.

(Continued)

*Primary Examiner* — Mohammad M Hoque
(74) *Attorney, Agent, or Firm* — Anthony Canale; Hoffman Warnick LLC

(57) ABSTRACT

A transistor structure with a multi-layer field plate and related methods are disclosed. The transistor structure includes a dielectric layer that has a thinner portion over a first doped well and a second doped well, and a thicker portion adjacent the thinner portion and over the second doped well. The thicker portion has a height greater than the thinner portion above the doped wells. The transistor includes a first gate structure on the thinner portion and a field plate on the thicker portion of the dielectric layer.

20 Claims, 12 Drawing Sheets

(56) References Cited

U.S. PATENT DOCUMENTS

| | | | |
|---|---|---|---|
| 9,184,252 | B2 | 11/2015 | Chuang et al. |
| 9,219,147 | B2 | 12/2015 | Toh et al. |
| 9,590,053 | B2 | 3/2017 | Chou et al. |
| 9,793,281 | B2 | 10/2017 | Su et al. |
| 9,871,132 | B1 | 1/2018 | Liu et al. |
| 9,905,687 | B1 | 2/2018 | Zhu et al. |
| 9,954,097 | B2 | 4/2018 | Chou et al. |
| 10,636,904 | B2 | 4/2020 | Chou et al. |
| 11,158,737 | B2 | 10/2021 | Jin et al. |
| 2009/0108350 | A1 | 4/2009 | Cai |
| 2012/0228704 | A1* | 9/2012 | Ju ................... H01L 29/66689 257/E29.256 |
| 2013/0134512 | A1* | 5/2013 | Cheng ................. H01L 29/402 257/E29.256 |
| 2013/0214354 | A1* | 8/2013 | Chan ................. H01L 29/66681 257/E21.409 |
| 2014/0197489 | A1* | 7/2014 | Chu ................... H01L 29/7816 438/286 |
| 2014/0264581 | A1* | 9/2014 | Chan ................... H01L 29/0878 438/289 |
| 2016/0218189 | A1* | 7/2016 | Oasa .................. H01L 29/7786 |
| 2017/0179280 | A1* | 6/2017 | Yadav ............... H01L 29/42356 |
| 2018/0261676 | A1 | 9/2018 | Sonsky |
| 2019/0027585 | A1 | 1/2019 | Wei et al. |
| 2019/0221666 | A1 | 7/2019 | Bang et al. |
| 2019/0288112 | A1* | 9/2019 | Wang ................... H01L 29/517 |
| 2019/0334032 | A1 | 10/2019 | Ho et al. |
| 2019/0363186 | A1 | 11/2019 | You et al. |
| 2019/0386134 | A1* | 12/2019 | Kim .................. H01L 29/66659 |
| 2020/0013888 | A1 | 1/2020 | Su et al. |
| 2020/0126990 | A1 | 4/2020 | Zhang |
| 2020/0168603 | A1 | 5/2020 | Chuang |
| 2020/0373395 | A1* | 11/2020 | Ho ...................... H01L 29/7816 |
| 2021/0036112 | A1 | 2/2021 | Xu |
| 2021/0234042 | A1 | 7/2021 | Xu |
| 2021/0328029 | A1* | 10/2021 | Liao ...................... H01L 23/291 |
| 2021/0376148 | A1 | 12/2021 | Lee |
| 2022/0157972 | A1* | 5/2022 | Mehrotra .............. H01L 29/402 |
| 2023/0307534 | A1* | 9/2023 | Hwang ............... H01L 29/7786 |

OTHER PUBLICATIONS

U.S. Patent Application titled: "Transistor Structure with Gate Over Well Boundary and Related Methods to Form Same," filed Jan. 6, 2022, 48 pages.

K. Mistry et al., "A 45nm Logic Technology with High-k+Metal Gate Transistors, Strained Silicon, 9 Cu Interconnect Layers, 193nm Dry Pattering, and 100% Pb-free Packaging", 2007 IEEE International Election Devices Meeting, Washington, DC, 2007, pp. 247-250.

U.S. Patent Application titled: "Integrated Circuit Structure with Metal Gate and Metal Field Plate Having Coplanar Upper Surfaces," filed Mar. 19, 2021, 31 pages.

U.S. Patent Application titled: "Structure and Method to Provide Conductive Field Plate Over Gate Structure," filed Sep. 23, 2020, 36 pages.

U.S. Appl. No. 17/647,195, Office Action dated Jul. 19, 2023, 30 pages.

U.S. Appl. No. 17/206,195, Office Action dated Mar. 29, 2022, 19 pages.

U.S. Appl. No. 17/029,446, Final Office Action dated Apr. 5, 2022, 12 pages.

* cited by examiner

TRANSISTOR STRUCTURE WITH MULTI-LAYER FIELD PLATE AND RELATED METHOD

BACKGROUND

The present disclosure relates generally to integrated circuits, and more specifically, to a transistor structure with a multi-layer field plate.

In planar field effect transistor (FET) structures, the proximity of gate contacts to other conductors may lead to unwanted parasitic capacitance or conduction, i.e., leakage, between these adjacent structures. This situation can adversely affect structural performance or yield. Some FETs are integrated into high voltage (HV) IC structures for handling high voltage input/output ("I/O") signals (e.g., those between one-hundred volts (V) and one-thousand V). Forming a gate structure for an HV IC structure can be challenging without creating the noted undesirable outcomes, such as short circuits.

SUMMARY

An aspect of the disclosure is directed to a transistor structure, including a field plate over a first dielectric layer. The field plate includes a first layer and a second layer over the first layer. The first layer includes a high dielectric constant metal gate (HKMG) stack. A gate structure is over the first dielectric layer and laterally adjacent to the field plate. The gate structure includes a polysilicon layer, and a gate spacer laterally between the polysilicon layer and the field plate.

Another aspect of the disclosure includes an integrated circuit (IC) structure, including an extended drain metal oxide semiconductor (EDMOS) transistor structure. The EDMOS transistor structure includes a field plate over a first dielectric layer, and a gate structure over the first dielectric layer and laterally adjacent to the field plate. The field plate includes a first layer and a second layer over the first layer. The first layer includes a high dielectric constant metal gate (HKMG) stack, and the second layer includes polysilicon. The gate structure includes a polysilicon layer, and a gate spacer laterally between the polysilicon layer and the field plate. A non-EDMOS transistor structure laterally distal to the EDMOS transistor structure.

An aspect of the disclosure related to a method of forming a transistor structure, including forming a field plate over a first dielectric layer. The field plate includes a first layer and a second layer over the first layer. The first layer includes a high dielectric constant metal gate (HKMG) stack. Forming a gate structure over the first dielectric layer and laterally adjacent to the field plate. The gate structure includes a polysilicon layer, and a gate spacer laterally between the polysilicon layer and the field plate.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
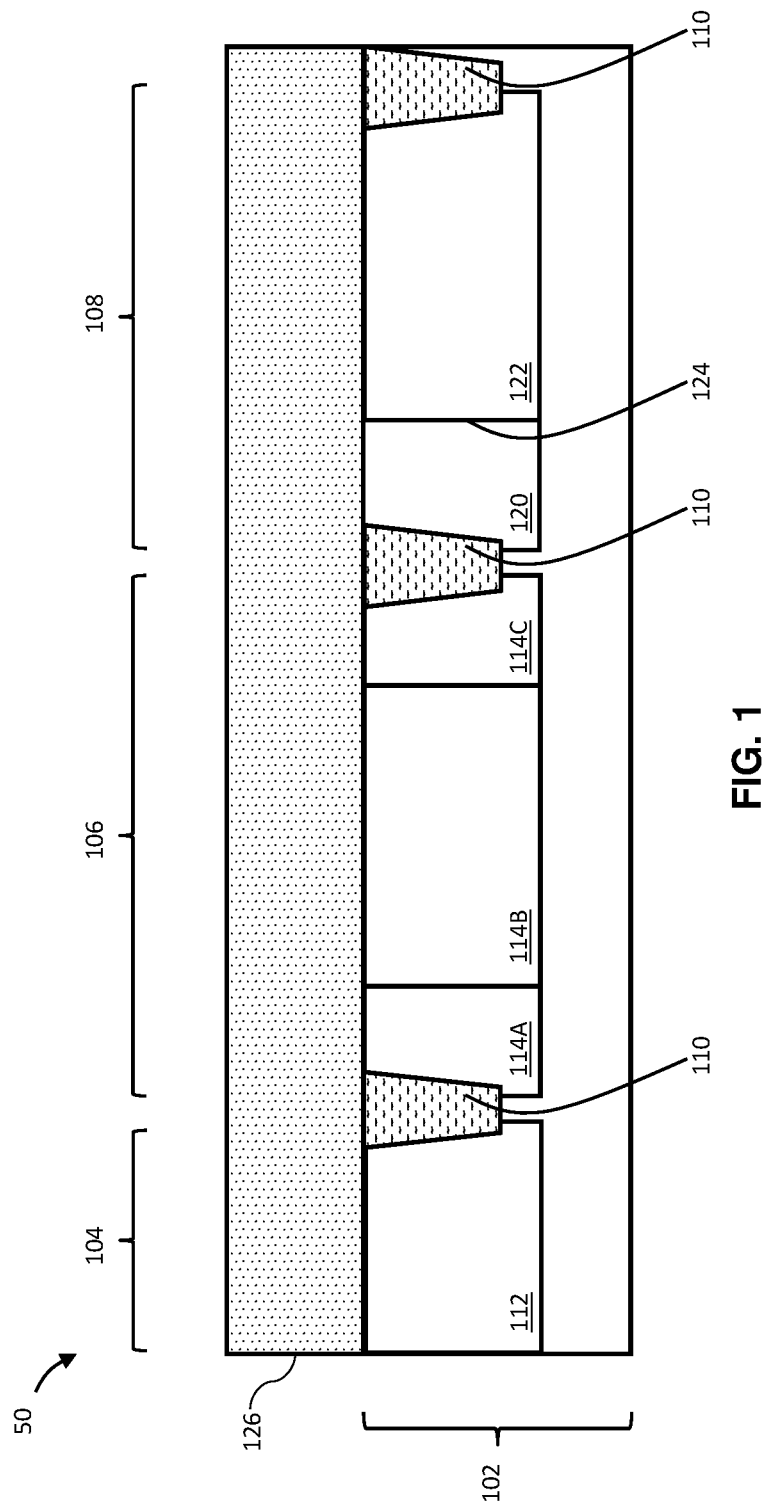
FIG. 1 shows a cross-sectional view of a preliminary structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

An integrated circuit (IC) structure according to the disclosure may provide, e.g., a transistor structure including a field plate over a first dielectric layer. The field plate includes multiple layers, e.g., a first layer including a high dielectric constant metal gate (HKMG) stack, and a second layer over the first layer including polysilicon. A gate structure is over the first dielectric layer and laterally adjacent to the field plate. The gate structure includes a polysilicon layer, and a gate spacer is laterally between the polysilicon layer and the field plate.

Referring to FIG. 1, a preliminary structure 50 to form an IC structure according to embodiments of the disclosure is shown. Preliminary structure 50 may be processed as described herein to yield an IC structure including an extended drain metal oxide semiconductor (EDMOS) transistor structure according to embodiments of the disclosure. However, it is understood that other techniques, ordering of processes, etc., alternatively may be implemented to yield an IC structure according to the disclosure. FIG. 1 shows a cross-sectional view of preliminary structure 50 with a substrate 102, e.g., one or more semiconductor materials. Substrate 102 may include but is not limited to: silicon, germanium, silicon germanium, silicon carbide, or any other common IC semiconductor substrates. A portion or entire semiconductor substrate 102 may be strained.

For purposes of reference, three doped well regions 104, 106, 108 for different types of structures are illustrated. Each region may be electrically isolated from another by respective trench isolations 110. Each trench isolation 110 may include a trench etched into substrate 102 and filled with an insulating material such as oxide, insulative semiconductor, etc., to isolate one region of the substrate from an adjacent region of the substrate. One or more structures of a given polarity may be formed on or partially within each doped well region 104, 106, 108 and isolated from others by trench isolations 110. Semiconductor substrate 102 may include a variety of doped wells therein for formation of different polarity transistors. Doped well region 104 includes, for example, a doped well 112 in substrate 102 for providing a complementary metal oxide semiconductor (CMOS) device 214 (FIGS. 8-12). Doped well region 106 includes, for example, three doped wells 114 including a doped well 114B laterally between a doped well 114A and a doped well 114C for providing a flash memory cell structure 208 (FIGS. 8-12). Doped well region 108 includes, for example, a first doped well 120 adjacent a second doped well 122 at a well boundary 124 in substrate 102 for providing a transistor structure 212 (FIGS. 8-12). First doped well 120 includes a first dopant type and second doped well 122 includes a second dopant type opposite the first dopant type. Each well may be formed using any appropriate n-type or p-type dopant and may be formed using any now known or later developed technique (e.g., in-situ doping or ion implantation). The opposite doping polarities in each well 120, 122 may define a "P-N junction" across well boundary 124. The term "P-N" refers to two adjacent materials having different types of conductivity (i.e., P-type and N-type), which may be induced through dopants within the adjacent material(s). In some embodiments, one or more of doped well regions 104, 106, 108 may be counter-doped.

Preliminary structure 50 may include a dielectric layer 126 over substrate 102. Dielectric layer 126 may be formed, e.g., by depositing gate dielectric material such as silicon dioxide ($SiO_2$). In the present embodiment, dielectric layer 126 includes silicon dioxide. In alternative embodiments, dielectric layer 126 may be formed, e.g., by depositing any now known or later developed high dielectric constant (high-K) material (K value of at least approximately 3.9). Dielectric layer 126 may include any material typically used for gate dielectrics such as but not limited to metal oxides such as: tantalum oxide ($Ta_2O_5$), barium titanium oxide ($BaTiO_3$), hafnium oxide ($HfO_2$), zirconium oxide ($ZrO_2$), aluminum oxide ($Al_2O_3$), or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity), or a combination of these materials.

As used herein, "depositing" may include any now known or later developed techniques appropriate for the material to be deposited including but are not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Dielectric layer 126 may be deposited, for example, using ALD.

Figure 2:
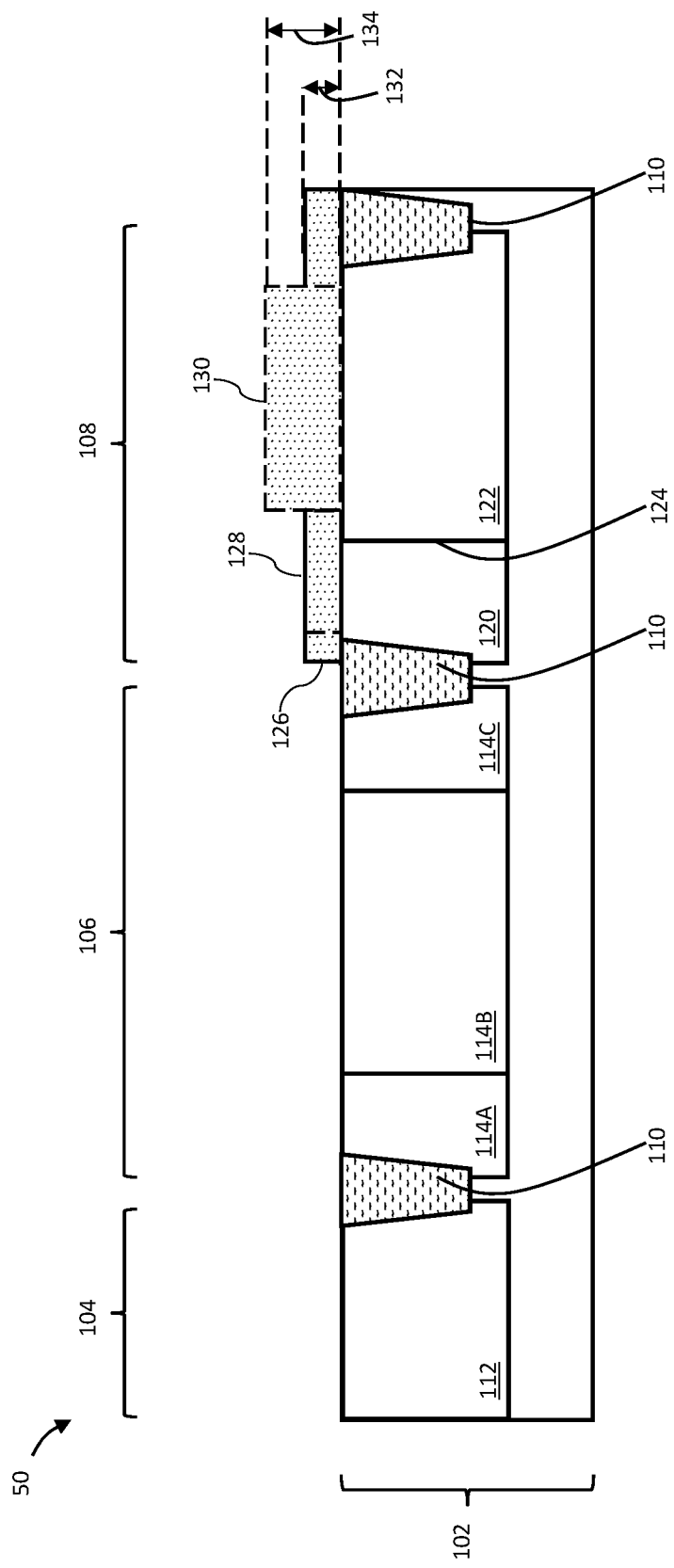
FIG. 2 shows a cross-sectional view of defining two portions of a dielectric layer according to embodiments of the disclosure.

Referring now to FIG. 2, embodiments of the disclosure may include removing portions of dielectric layer 126 using, e.g., a mask (not shown) with an opening at a targeted position to expose dielectric layer 126. This removal process may include, forming a mask patterned to expose selected portion(s) of dielectric layer 126. The mask (not shown) may include any now known or later developed appropriate masking material, e.g., a nitride hard mask. Any appropriate etching process, e.g., a reactive ion etch (RIE), can remove selected portion(s) of dielectric layer 126. As shown in FIG. 2, continued processing may include removing portions of dielectric layer 126 to yield a first portion 128 of dielectric layer 126 adjacent to a second portion 130 of dielectric layer 126. First portion 128 of dielectric layer 126 is over first doped well 120, second doped well 122, and well boundary 124. First portion 128, moreover, has a first height 132 above doped well region 108. Second portion 130 of dielectric layer 126 is over second doped well 122 and has a second height 134 above doped well region 108 that is greater than first height 132 above doped well region 108. Forming dielectric layer 126 may include forming a first mask patterned to recess dielectric layer 126 to second height 134 and forming a second mask (not shown) patterned to expose second portions 128 of dielectric layer 126 to reduce second portions 128 to first height 132. Where portions 128, 130 have a substantially uniform composition, they may be distinguished from one another based on their relative heights and horizontal positions. Thus, there may not be a visible physical boundary between portions 128, 130 of dielectric layer 126. First portion 128 may not necessarily include the same materials as second portion 130. For example, first portion 128 may include a middle voltage gate oxide (MVGOX) and second portion 130 may include a high voltage gate oxide (HVGOX). In another example, second portion 130 may include multiple materials, e.g., it may include an upper portion that includes HVGOX and a lower portion that includes MVGOX. In yet another example, second portion 130 may include an upper portion that includes HVGOX and a lower portion that includes MVGOX.

As discussed herein, portions 128, 130 of dielectric layer 126 may be formed in part by etching. Etching generally refers to the removal of material from a substrate (or structures formed on the substrate) and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive ion etching (RIE) operates under conditions intermediate between sputter and plasma etching and may be used to produce deep, narrow features, such as shallow trench isolation (STI) trenches. In one non-limiting example, a RIE may be used to etch dielectric layer 126.

Figure 3:
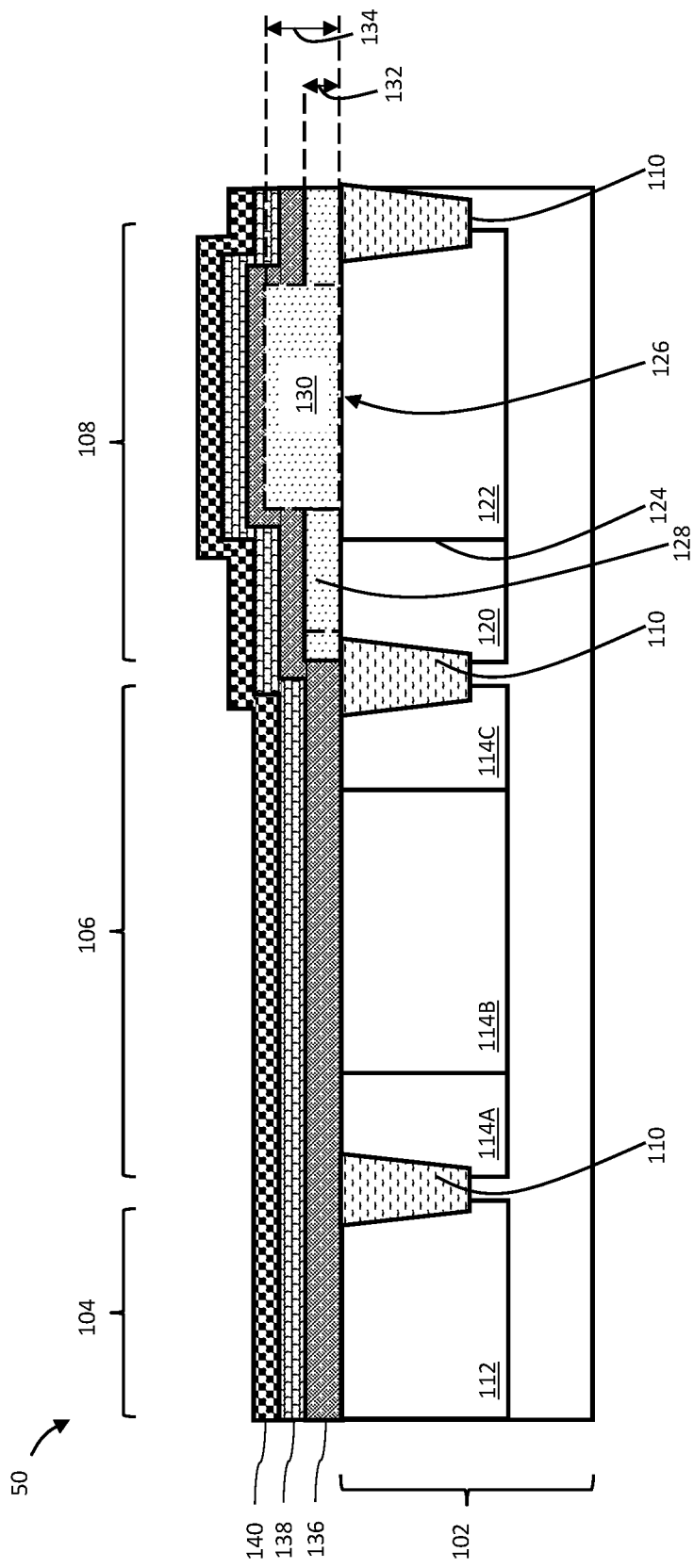
FIG. 3 shows a cross-sectional view of forming additional material layers on the structure according to embodiments of the disclosure.
Figure 4:
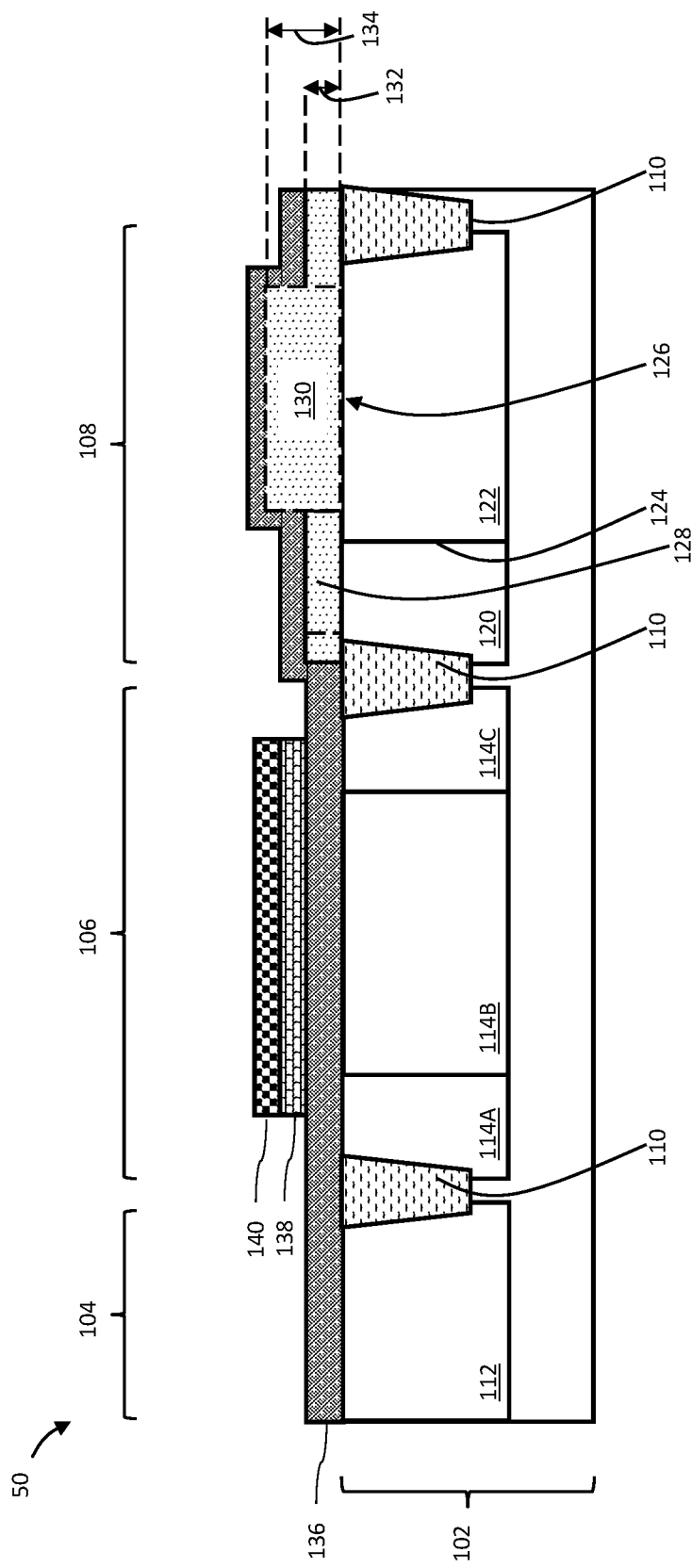
FIG. 4 shows a cross-sectional view of selectively removing portions of the additional material layers according to embodiments of the disclosure.

Referring now to FIG. 3, embodiments of the disclosure may include depositing a plurality of material layers over exposed portions of preliminary structure 50. The plurality of material layers may include a dielectric layer 136 over substrate 102 and dielectric layer 126, a semiconductor material layer 138 over dielectric layer 136, and an insulative stack 140 over semiconductor material layer 138. Dielectric layer 136 may be formed, e.g., by depositing any now known or later developed high-K material typically used for gate dielectrics such as but not limited to metal oxides. Semiconductor material layer 138 may be formed, e.g., by depositing semiconductor material such as but not limited to polysilicon (poly-Si). Insulative stack 140 may be formed, e.g., by depositing two or more layers of insulative material such as but not limited to oxide and nitride. Insulative stack 140 may include, for example, an oxide-nitride-oxide (ONO) stack over semiconductor material layer 138. Additional processing may include selectively removing portions of semiconductor material layer 138 and insulative stack 140 over dielectric layer 136. For example, as shown in FIG. 4, embodiments of the disclosure may include selectively removing portions of semiconductor material layer 138 and insulative stack 140 over doped well regions 104, 108. Remnants of semiconductor material layer 138 and insulative stack 140 remain over doped well region 106 and additional processing may be used, for example, to form a flash memory cell structure (FIGS. 8-12) over doped well region 106.

Figure 5:
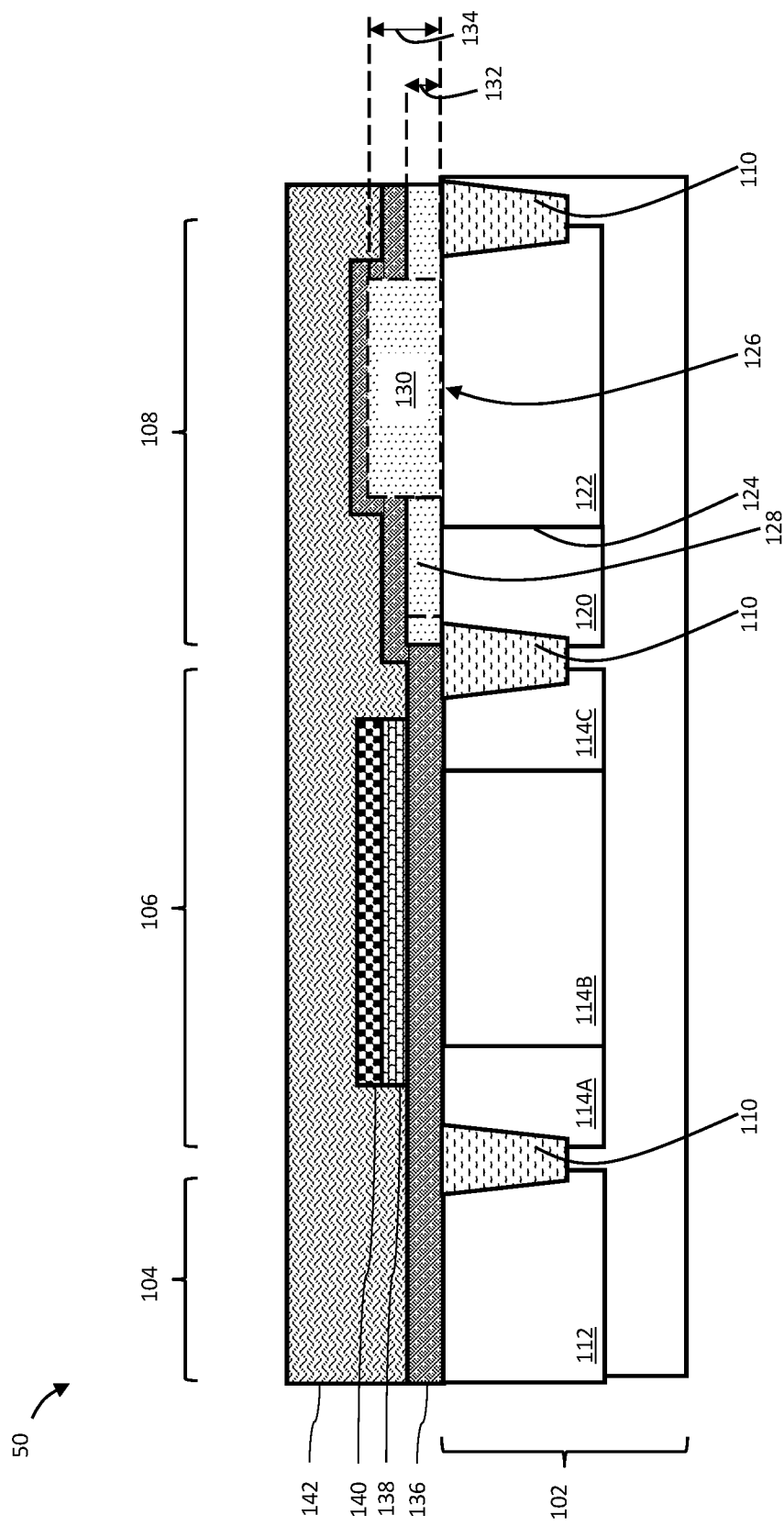
FIG. 5 shows a cross-sectional view of forming a semiconductor material according to embodiments of the disclosure.

Referring now to FIG. 5, embodiments of the disclosure may include depositing a semiconductor material 142 on any exposed materials to cover dielectric layer 136 and insulative stack 140. Semiconductor material 142 may include semiconductor material such as, but not limited to polycrystalline silicon (poly-Si). As will be described, additional processing may include selectively removing portions of semiconductor material 142 over doped well 114B in doped well region 106. The structure so formed which will be used, for example, to form a flash memory cell structure (FIGS. 8-12) over doped well region 106.

Figure 6:
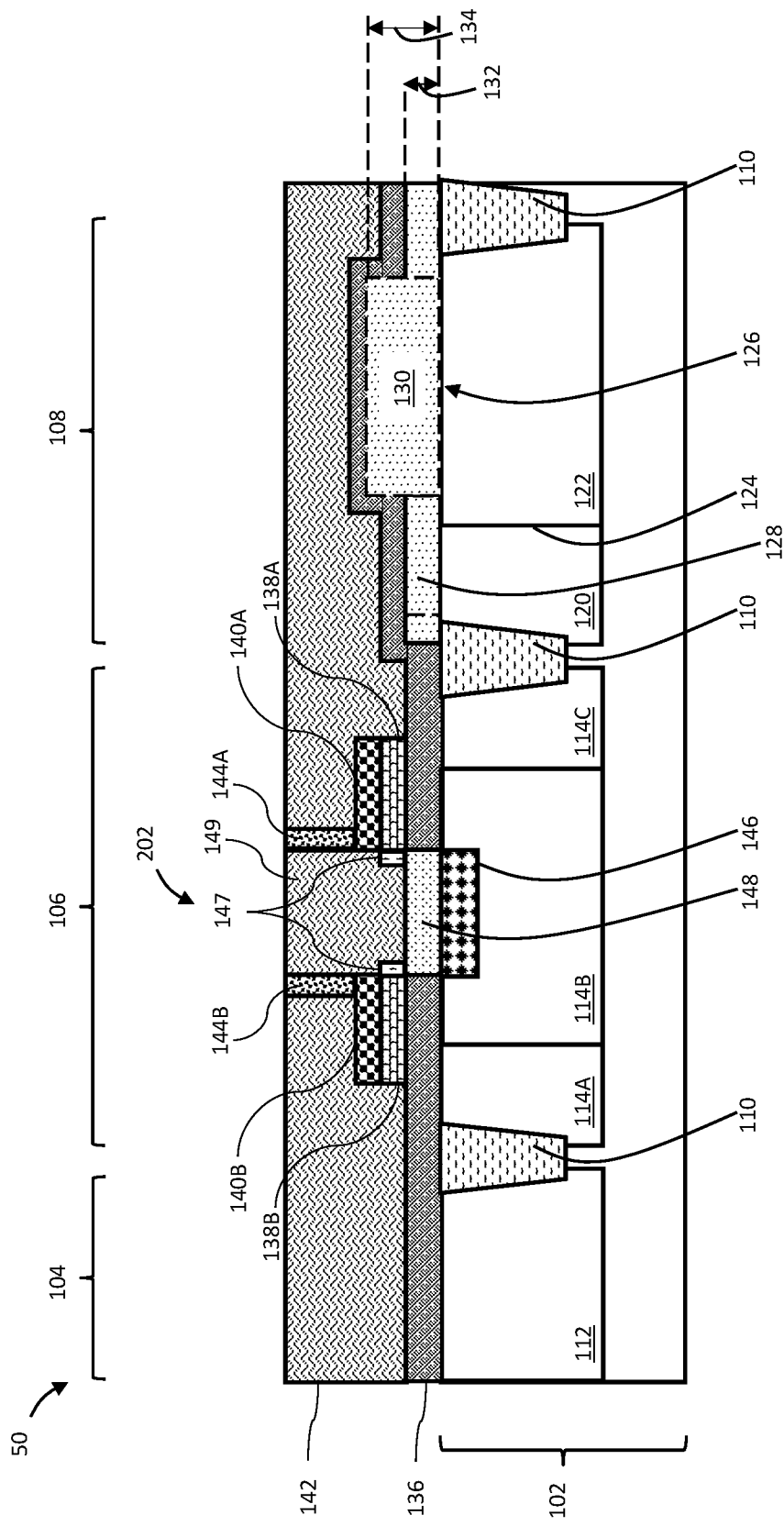
FIG. 6 shows a cross-sectional view of forming an erase gate structure according to embodiments of the disclosure.

Referring now to FIG. 6, embodiments of the disclosure may include forming an erase gate structure 202 over doped well 114B. The term "erase gate structure," as used herein, refers to a structure electrically coupled to a line for transmitting an electrical signal to a memory cell to instruct the memory cell to erase stored data. Forming erase gate structure 202 may include selectively removing portions of semiconductor material 142 over doped well 114B to expose an upper surface of insulative stack 140 and forming a pair of sidewall spacers 144A, 144B over insulative stack 140. Forming pair of sidewall spacers 144A, 144B may include depositing a layer of spacer material (not shown) over exposed surfaces and selectively removing portions of deposited spacer material to form pair of sidewall spacers 144A, 144B. Pair of sidewall spacers 144A, 144B may structurally and electrically isolate erase gate structure 202 from adjacent components. Additional processing to form erase gate structure 202 may include, for example, selectively removing portions of insulative stack 140, semiconductor material layer 138, and dielectric layer 136, e.g., by using a mask (not shown) to expose target portions of preliminary structure 50 over doped well 114B and etching. Selectively removing portions of semiconductor material layer 138 yields a semiconductor material layer 138A and a semiconductor material layer 138B. Selectively removing portions of insulative stack 140 may yield multiple insulative stacks, e.g., an insulative stack 140A and an insulative stack 140B.

Figure 9:
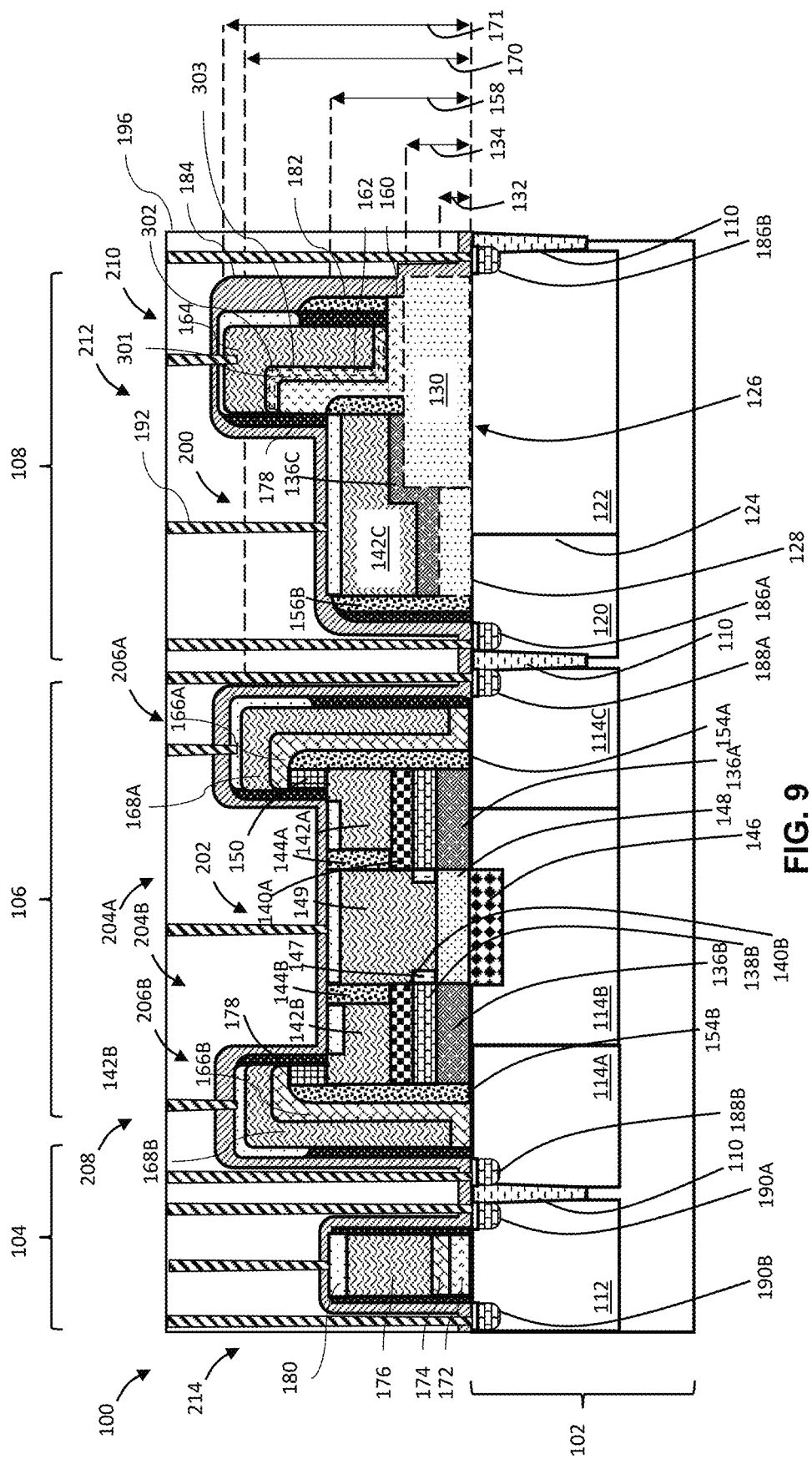
FIG. 9 shows a cross-sectional view of an integrated circuit structure according to embodiments of the disclosure.
Figure 10:
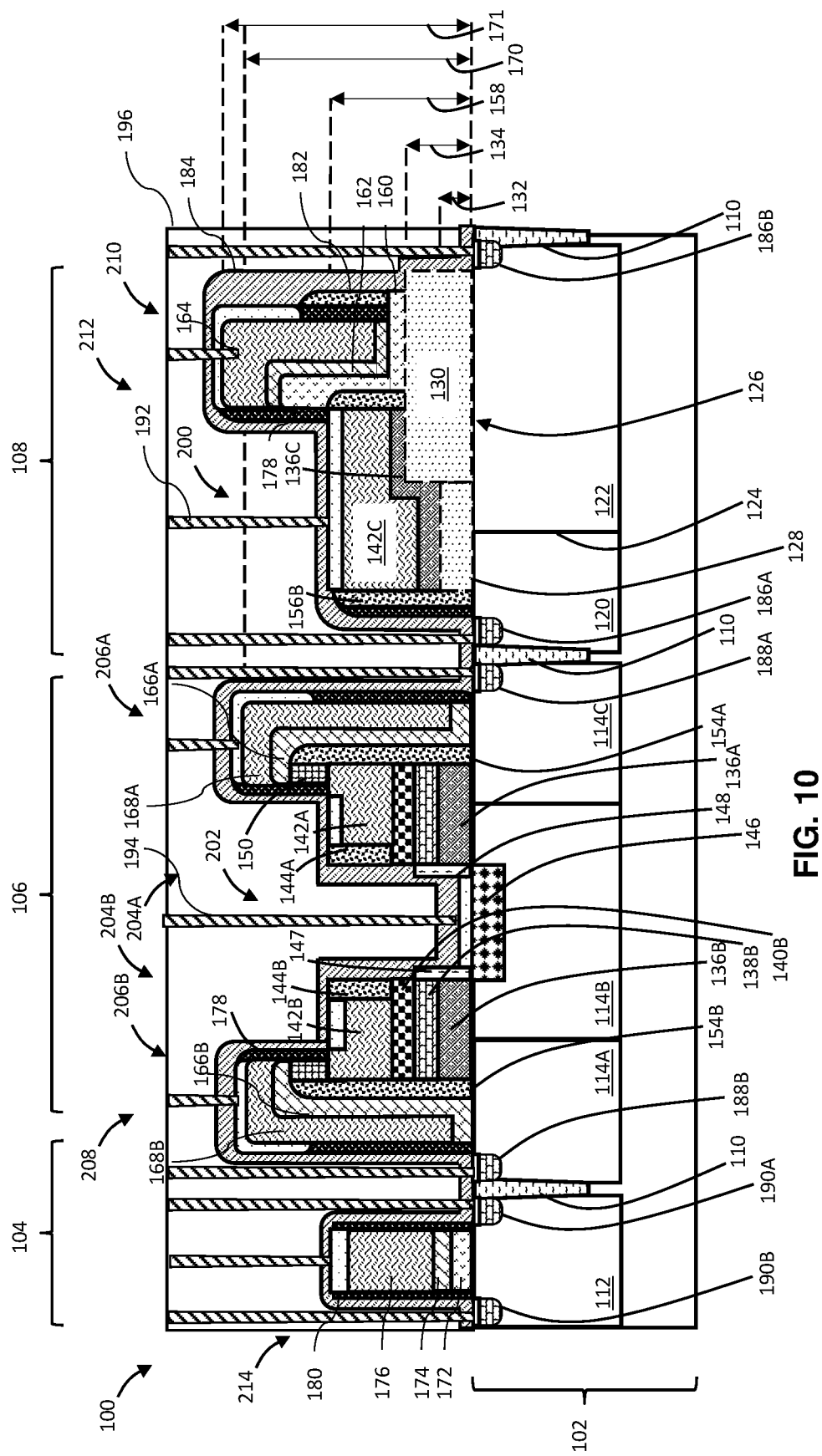
FIG. 10 shows a cross-sectional view of a second integrated circuit structure according to embodiments of the disclosure.

As further shown in FIG. 6, embodiments of the disclosure may include additional processing to form erase gate structure 202 such as forming a highly doped region 146 within doped well 114B and depositing a dielectric layer 148 over highly doped region 146. The method may further include forming an insulative tunnel 147 over dielectric layer 148 and laterally abutting semiconductor material layers 138A, 138B to electrically isolate erase gate structure 202 from adjacent components. Insulative tunnel 147 may include insulative material such as but not limited to oxide. Additional processing may include depositing a semiconductor material 149 over doped well 114B and horizontally between pair of sidewall spacers 144A, 144B. Semiconductor material 149 may include semiconductor material such as but not limited to poly-Si. Erase gate structure 202 may be useful, for example, to form a non-EDMOS transistor structure over doped well region 106, such as a flash memory cell structure (FIGS. 8-10).

Figure 7:
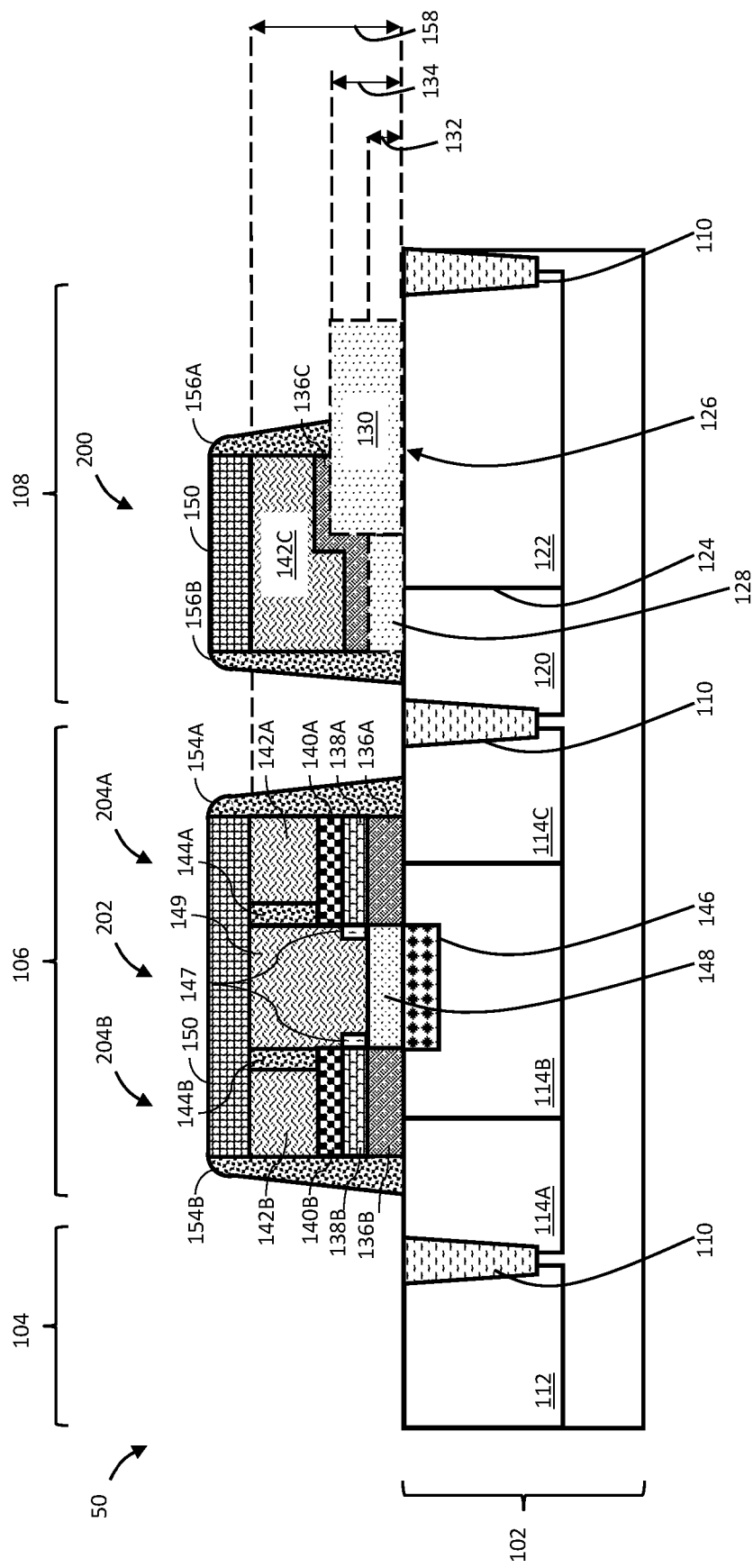
FIG. 7 shows a cross-sectional view of forming a gate structure and a set of control gates according to embodiments of the disclosure.

Referring now to FIG. 7, embodiments of the disclosure may include processing preliminary structure 50 to form a gate structure 200 over doped well region 108 and a pair of control gate structures 204A, 204B over doped well region 106. Forming gate structure 200 and pair of control gate structures 204A, 204B may include forming a mask 150 over portions of preliminary structure 50 to protect underlying material from subsequent processing. The method may include selectively removing, e.g., etching, exposed target portions of semiconductor material 142 and dielectric layer 136. In the illustrated example, the method includes selectively removing portions of semiconductor material 142 to yield a polysilicon layer 142A, a polysilicon layer 142B, and a polysilicon layer 142C. The method further may include selectively removing portions of dielectric layer 136 to yield a dielectric layer 136A, a dielectric layer 136B, and a dielectric layer 136C. In the present embodiment, dielectric layers 136A, 136B, 136C each include a same gate oxide material and are simultaneously formed. Polysilicon layers 142A, 142B and dielectric layers 136A, 136B are used to form, for example, pair of control gate structures 204A, 204B over doped well region 106. Polysilicon layer 142C and dielectric layer 136C may be used to form, for example, gate structure 200 over doped well region 108.

As further shown by FIG. 7, embodiments of the disclosure may include gate structure 200 having dielectric layer 136C over dielectric layer 126 and polysilicon layer 142C over dielectric layer 136C. Dielectric layer 136C may be on first portion 128 and second portion 130 of dielectric layer 126, and vertically between polysilicon layer 142C and dielectric layer 126. Gate structure 200 may have a height 158 above substrate 102. Forming gate structure 200 may include selectively removing portions of dielectric layer 136 (FIG. 6) and semiconductor material 142 (FIG. 6) to yield dielectric layer 136C and polysilicon layer 142C using, e.g., a mask 150 to expose target portions of semiconductor material 142 and dielectric layer 136 and etching. Additional processing may include forming a pair of gate spacers 156A, 156B to electrically isolate gate structure 200 from adjacent components. Forming pair of gate spacers 156A, 156B may include depositing a layer of spacer material (not shown) (e.g., nitride) over exposed surfaces and selectively removing portions of deposited spacer material to form pair of gate spacers 156A, 156B. As further shown by FIG. 7, embodiments of the disclosure may include forming pair of control gate structures 204A, 204B over doped well 114B. First control gate structure 204A includes a stack of material layers positioned over doped well 114B and doped well 114C, the stack of material layers including dielectric layer 136A, semiconductor material layer 138A, insulative stack 140A, and polysilicon layer 142A. Second control gate structure 204B includes a stack of material layers positioned over doped well 114A and doped well 114B, the stack of material layers including dielectric layer 136B, semiconductor material layer 138B, insulative stack 140B, and polysilicon layer 142B. Pair of control gate structures 204A, 204B may have height 158 above substrate 102 that is equal, or substantially similar to, height 158 of gate structure 200. Additional processing may include forming a pair of gate spacers 154A, 154B to electrically isolate pair of control gate structures 204A, 204B from adjacent components. Forming pair of gate spacers 154A, 154B may include depositing a layer of spacer material (not shown) (e.g., nitride) over exposed surfaces and selectively removing portions of deposited spacer material to form pair of gate spacers 154A, 154B. Pair of gate spacers 154A, 154B and spacers 156A, 156B may include horizontally tapered ends. Pair of gate spacers 154A, 154B may be formed at the same time as spacers 156A, 156B. Alternatively, as shown in FIGS. 8-12, pair of gate spacers 154A, 154B and spacers 156A, 156B may not include horizontally tapered ends. Pair of control gate structures 204A, 204B and pair of gate spacers 154A, 154B may be used, for example, to form a non-EDMOS transistor structure over doped well region 106, such as a flash memory cell structure (FIGS. 8-10).

Figure 8:
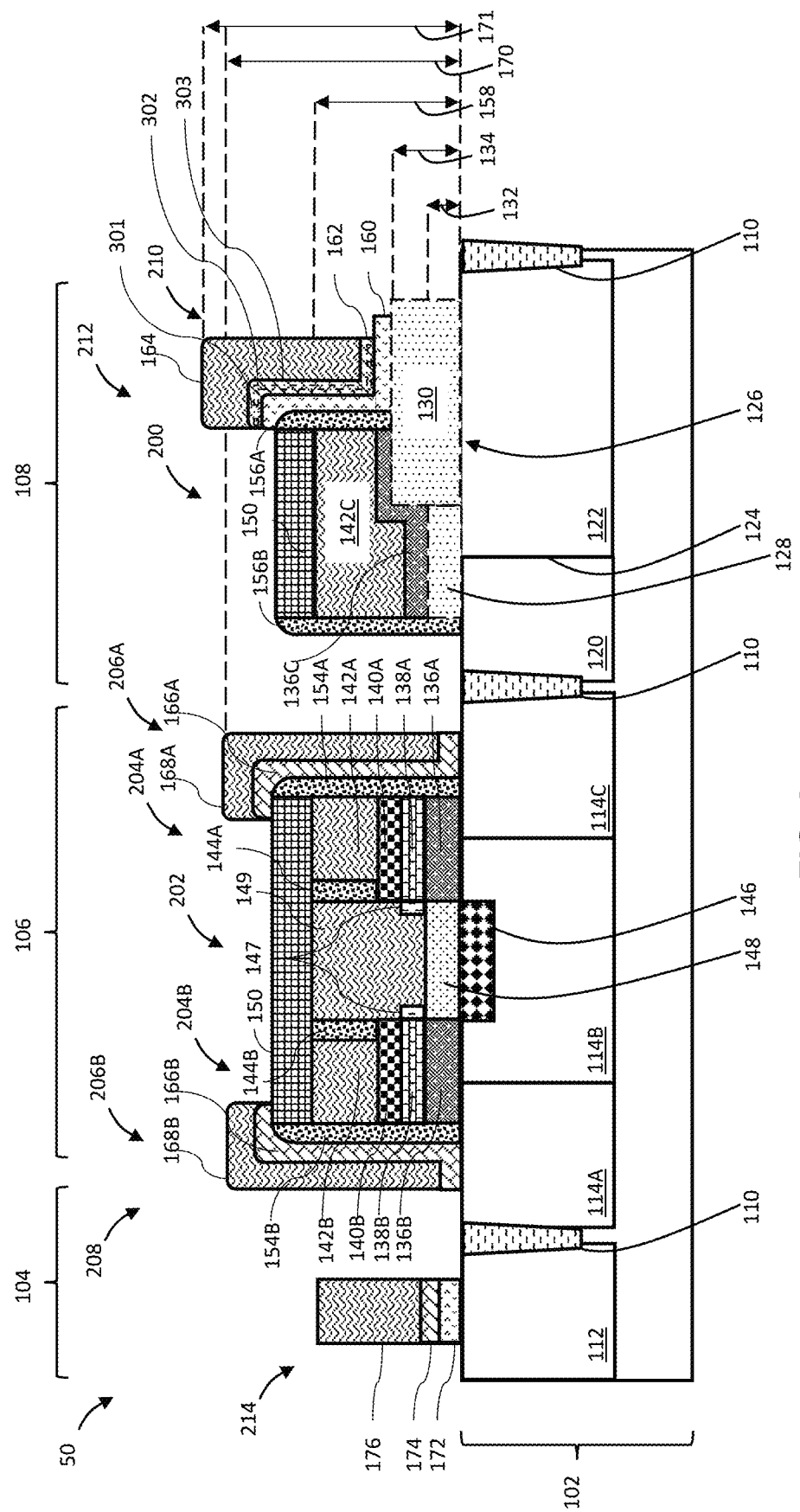
FIG. 8 shows a cross-sectional view of forming a field plate, a set of word line gates, and a CMOS device according to embodiments of the disclosure.

Referring now to FIG. 8, embodiments of the disclosure may include forming a transistor structure 212 over doped well region 108. Transistor structure 212 may include gate structure 200 and a field plate 210 having a height 171 over substrate 102. Field plate 210 is over second portion 130 of dielectric layer 126 and laterally adjacent to gate structure 200. Field plate 210 may include a first layer 162 over second portion 130 of dielectric layer 126, and a second layer 164 over first layer 162. First layer 162 may include a high dielectric constant metal gate (HKMG) stack. Second layer 164 may include a semiconductor material such as but not limited to polysilicon or amorphous silicon. In some embodiments, as shown in FIG. 8, field plate 210 may include a hard mask remnant 160 over second portion 130 of dielectric layer 126. Hard mask remnant 160 may include masking material such as but not limited to silicon germanium (SiGe).

Forming first layer 162 may include forming an HKMG stack, e.g., by depositing a conformal layer of a high-K 301 dielectric material typically used for gate dielectric layers. Forming the HKMG stack may include depositing a work function metal (WFM) layer 302 over a high-K dielectric material 301 and using, e.g., a mask (not shown) to expose a target portion(s) of the WFM layer 302 to selectively remove (e.g., etching) exposed target portion(s) of the WFM layer 302 from high-K material layer 301 (not shown). Subsequent processing may include applying a heat treatment (e.g., annealing) to embed the WFM layer 302 within the high-K material layer 301. The WFM layer 302 may include one of a p-type or n-type WFM. The method may further include depositing a metal layer 303 (not shown) such as, e.g., titanium nitride (TiN), over the high-K material layer 301 embedded with the WFM layer 302. In the present embodiment, first layer 162 is an HKMG stack that includes a n-type WFM 302 embedded within a high-K dielectric material 301 over second portion 130 of dielectric layer 126 in doped well region 108, and a metal layer 303 of TiN over the high-K dielectric material 301. Subsequent processing may be useful to form, for example, an n-type or p-type EDMOS transistor (FIG. 9).

Forming second layer 164 may include depositing a semiconductor material (not shown) on any exposed materials to cover first layer 162. Semiconductor material may include any semiconductor material such as but not limited to poly-Si or amorphous silicon. Additional processing, e.g., etching, of semiconductor material may yield second layer 164 useful to form field plate 210 over substrate 102. Second layer 164 may include a doped semiconductor material formed using any appropriate n-type or p-type dopant and may be formed using any now known or later developed technique (e.g., in-situ doping or ion implantation).

A "field plate," as used herein, refers to a structure for reducing peak electric field and enhance breakdown voltage during operation of transistors. Field plate structures spread out an electric field and mitigate peaking of the electric field to achieve a desirable electrical field profile and increase breakdown voltage of a transistor.

As further shown in FIG. 8, embodiments of the disclosure may include forming a flash memory cell structure 208 over doped well region 106. Flash memory cell structure 208 may include erase gate structure 202, pair of control gate structures 204A, 204B, and a pair of word line gate structures 206A, 206B over doped well region 106. Pair of word line gate structures 206A, 206B includes a first word line gate structure 206A and a second word line gate structure 206B having a height 170 over substrate 102. First word line gate structure 206A is positioned over doped well 114C and includes a first layer 166A and a second layer 168A. Second word line gate structure 206B is positioned over doped well 114A and includes a first layer 166B and a second layer 168B. First layers 166A, 166B each include a HKMG stack as described herein regarding first layer 162 of field plate 210. Second layers 168A, 168B each include a semiconductor material such as but not limited to poly-Si. A "flash cell memory structure," as used herein, refers to a split-gate flash memory cell configured to retain data stored in the memory cell. The split-gate flash memory cell includes, for example, an erase gate structure, a pair of control gate structures, and a pair of word line gate structures over a doped well region.

As further shown in FIG. 8, embodiments of the disclosure may include forming a CMOS device 214 having height 158 over substrate 102. CMOS device 214 is over doped well region 104 and laterally distal to gate structure 200. CMOS device 214 may include a first layer 172 over doped well 112, the former of which may include selective silicon germanium (cSiGe). A second layer 174 over first layer 172 may include a HKMG stack. A third layer 176 over second layer 174 may include a semiconductor material such as but not limited to poly-Si. First layer 172, second layer 174, and third layer 176 may collectively form a gate structure of CMOS device 214. The method may include forming a gate structure of CMOS device 214 simultaneously with field plate 210 and pair of word line gate structures 206A, 206B.

Referring now to FIG. 9, embodiments of the disclosure include forming electrically active source/drain ("S/D") regions. S/D regions are electrically active regions in a semiconductor substrate that define opposite terminals for current flow through the transistor. When a voltage is applied to the gate of the transistor, a conductive channel enables current flow between source and drain. For example, FIG. 9 shows forming a source region 186A and a drain region 186B in doped well region 108, a source region 188A and a drain region 188B in doped well region 106, and a source region 190A and a drain region 190B in doped well region 104 of substrate 102. As will be recognized, source/drain regions are doped with a dopant having a selected polarity for a respective transistor. An n-type transistor may include n-type dopants such as but not limited to: phosphorous (P), arsenic (As), antimony (Sb), and a p-type transistor may include p-type dopants such as but not limited to: boron (B), indium (In) and gallium (Ga). Similar dopants, typically with different concentrations, may be used for doped wells 112, 114, 116, 118, 120, 122. Any suitable thermal process may be carried out to drive in the dopants. It is understood that processing for S/D regions may be carried out before spacer formation. S/D regions 186A/186B, 188A/188B, 190A/190B may be formed using any now known or later developed technique, e.g., in-situ doping, ion implantation, etc. Dopants used may be any dopant appropriate for the transistor to be formed. Any necessary anneal to drive in dopants may be performed.

As further shown by FIG. 9, embodiments of the disclosure may include additional processing to form IC structure 100. The method may include, for example, forming a sidewall spacer 178 to electrically isolate transistor structure 212, flash memory cell structure 208, and CMOS device 214 from adjacent components. Forming sidewall spacer 178 may include depositing a layer of spacer material (not shown) (e.g., nitride) over exposed surfaces and selectively removing portions of deposited spacer material.

As further shown in FIG. 9, embodiments of the disclosure may include forming a silicide layer 180 on upper surfaces of gate structure 200, field plate 210, flash memory cell structure 208, and S/D regions 186A/186B, 188A/188B, 190A/190B. Silicide layer 180 may improve electrical coupling of gate structure to other electrical components (not shown). Silicide layer 180 formation may include forming a silicide block mask (not shown) to expose select portion(s) of preliminary structure 50 and depositing a layer of conductive metal(s) (not shown) over exposed portions of preliminary structure 50. Silicide layer 180 formation may include depositing a layer of conductive metal(s), applying a heat treatment (e.g., rapid thermal annealing) such that the conductive metal(s) combine with underlying semiconductor material, and removing any excess metal to yield silicide layer 180 on the upper surface of gate structure 200, field plate 210, flash memory cell structure 208, and S/D regions 186A/186B, 188A/188B, 190A/190B. The method may include removing portions of the silicide blocking mask (not shown) and yielding, for example, self-aligned silicide ("silicide") blocking (SAB) spacer 184 over second portion 130 of dielectric layer 126.

As further shown by FIG. 9, embodiments of the disclosure may include additional processing to form IC structure 100. The method may include, for example, depositing a stress inducing liner (simply "stress liner" hereafter) 184 over exposed surfaces, forming an interlayer dielectric (not shown) over stress liner 184, and forming one or more contacts 192 through the interlayer dielectric. Stress liner 184 may include one or more stress liners such as, but not limited to, one or more of the following: tensile stress liner for NMOS transistors, compressive stress liner for PMOS transistors, or neutral stress liners. Stress liner 184 may act as an etch stop layer when forming contacts 192. Any appropriate middle-of-line and back-end-of-line processing may be carried out to form contacts 192 to gate structure 200, erase gate structure 202, pair of word line gate structures 206A/206B, field plate 210, CMOS device 214, and S/D regions 186A/186B, 188A/188B, 190A/190B. As the processes to form stress liners and contacts are well known, no further details will be provided. Any necessary etch stop layers, e.g., single, or dual contact etch stop layers, may be employed, and any silicidation can be carried out as known in the field as part of the processes.

FIG. 9 depicts one embodiment of IC structure 100 including transistor structure 212, flash memory cell structure 208, and CMOS device 214. Transistor structure 212 is a high voltage EDMOS (HV EDMOS) transistor that includes gate structure 200 and field plate 210 over doped well region 108. Flash memory cell structure 208 is a non-EDMOS transistor structure laterally distal to transistor structure 212 over doped well region 106 that includes erase gate structure 202, pair of control gate structures 204A/204B, pair of gate spacers 154A/154B, and pair of word line gate structures 206A/206B. CMOS device 214 is a logic transistor structure laterally distal to transistor structure 212 over doped well region 104.

In an example, transistor structure 212 includes gate structure 200 laterally adjacent to field plate 210 over dielectric layer 126. Gate structure 200 is on first and second portions 128, 130 of dielectric layer 126, and over first doped well 120, second doped well 122, and well boundary 124. Gate structure 200 includes dielectric layer 136C, polysilicon layer 142C and pair of gate spacers 156A, 156B. Dielectric layer 136C vertically separates polysilicon layer 142C and dielectric layer 126. Pair of gate spacers 156A, 156B electrically isolate gate structure 200 from adjacent components. For instance, gate spacer 156A may be laterally between dielectric layer 136C/polysilicon layer 142C and field plate 210 to electrically isolate gate structure 200 from field plate 210. Field plate 210 is on second portion 130 of dielectric layer 126 and over second doped well 122. Field plate 210 includes first layer 162 and second layer 164 over first layer 162. First layer 162 includes an HKMG stack and second layer 164 includes polysilicon. Field plate 210 may include hard mask remnant 160 vertically between first layer 162 and second portion 130 of dielectric layer 126. Gate structure 200 and field plate 210 each include silicide layer 180 to electrically couple transistor structure 212 to other electrical components via contacts 192.

As further shown in FIG. 9, embodiments of the disclosure may include forming one or more devices configured for different voltage requirements (e.g., logic transistors) adjacent transistor structure 212. For example, IC structure 100 includes CMOS device 214 in region 104 and a non-EDMOS structure, e.g., flash memory cell structure 208, in doped well region 106. Field plate 210 may be included within flash memory cell structure 208. In the present embodiment, IC structure 100 includes flash memory cell structure 208 having pair of control gate structures 204A, 204B laterally between pair of word line gate structures 206A, 206B, and erase gate structure 202 laterally between pair of control gate structures 204A, 204B. Pair of control gate structures 204A, 204B have height 158 above substrate 102. Pair of word line gate structures 206A, 206B have height 170 above substrate 102 greater than height 158 and less than height 171 of field plate 210.

FIG. 10 depicts another embodiment of IC structure 100 having a source line contact 194 in flash memory cell structure 208. IC structure 100 is substantially similar to the embodiment described in FIG. 9 but additional processing, e.g., etching, removes material from erase gate structure 202 before source line contact 194 formation.

Figure 11:
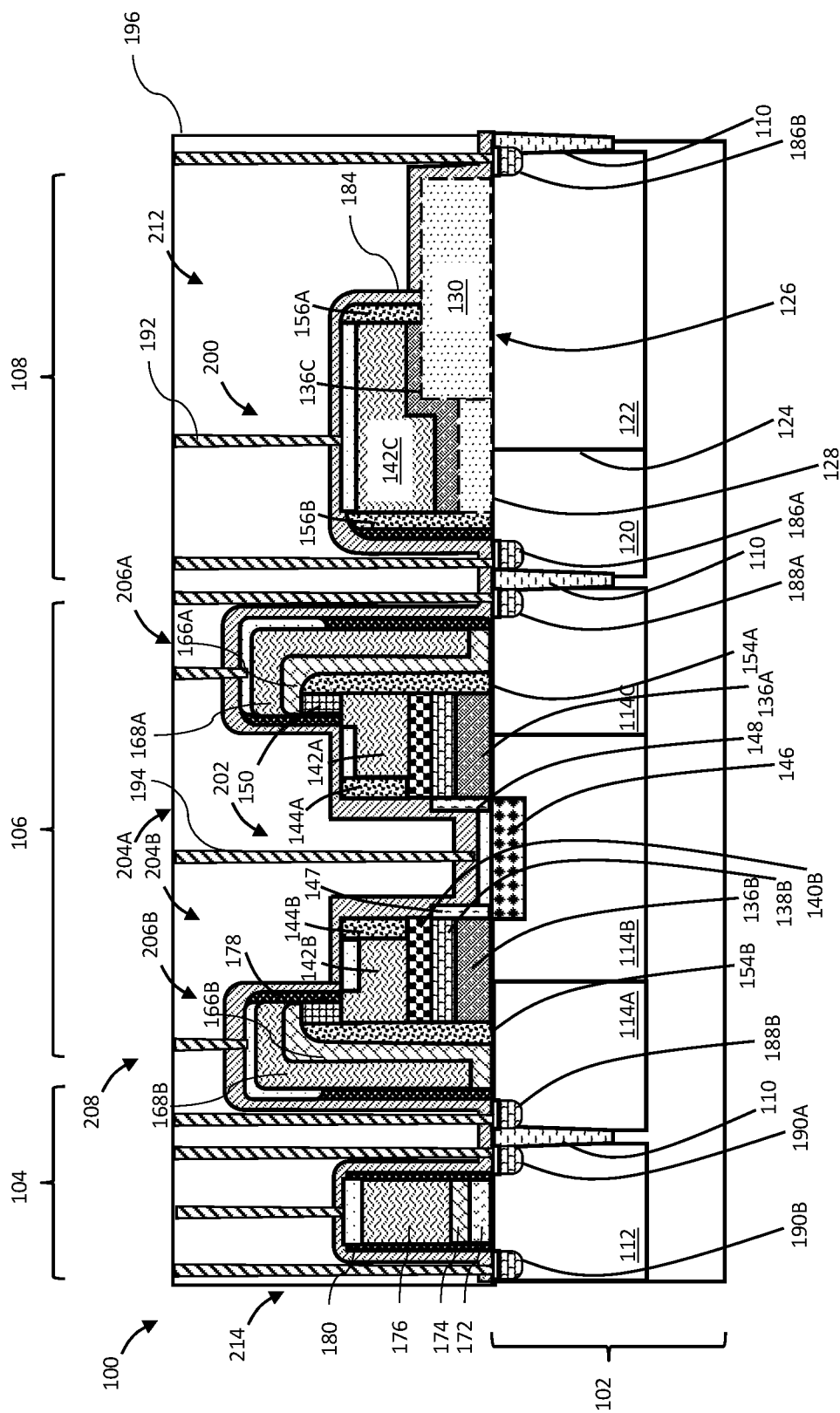
FIG. 11 shows a cross-sectional view of a third integrated circuit structure according to embodiments of the disclosure.

FIG. 11 depicts another embodiment of IC structure 100 having transistor structure 212 that includes gate structure 200 and does not include field plate 210. IC structure 100 is substantially similar to the embodiment described in FIG. 10 but transistor structure 212 does not include field plate 210. Forming transistor structure 212 may include, for example, using a mask (not shown) to prevent second portion 130 of dielectric layer 126 from exposure to additional processing that would otherwise form field plate 210 (FIGS. 9-10). For example, forming HKMG stacks (e.g., first layers 166A/166B) may include using a mask (not shown) over doped well region 108 such that only portions of doped well region 106 and 108 are exposed to subsequent processing (e.g., forming HKMG stacks).

Figure 12:
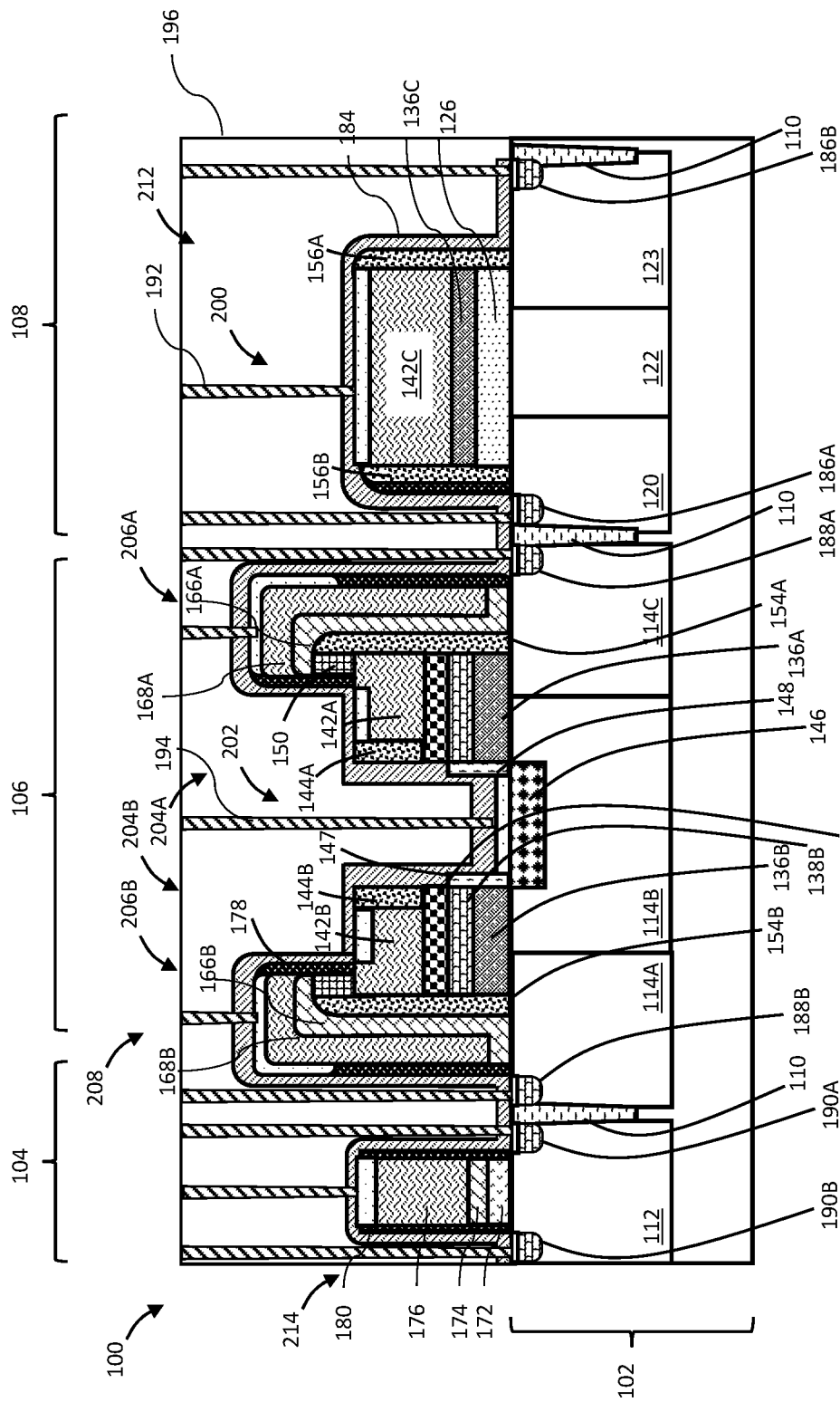
FIG. 12 shows a cross-sectional view of a fourth integrated circuit structure according to embodiments of the disclosure.

FIG. 12 depicts another embodiment of IC structure 100 having transistor structure 212 that includes gate structure 200. IC structure 100 is substantially similar to the embodiment described in FIG. 9, but transistor structure 212 is a high voltage metal oxide semiconductor (HV MOS) device over doped well region 108. In the present embodiment, transistor structure 212 is an HV MOS device over doped well region 108 that includes doped well 122 positioned laterally between doped well 120 and a doped well 123. Transistor structure 212 may include dielectric layer 126 having a substantially uniform height above substrate 102. Transistor structure may include dielectric layer 136C vertically between dielectric layer 126 and polysilicon layer 142C. Transistor structure 212 may include pair of gate spacers 156A/156B to electrically isolate transistor structure 212 from adjacent components. Alternatively, transistor structure 212 is a middle voltage metal oxide semiconductor (MV MOS) device.

Embodiments of the present invention provide technical and commercial advantages, and some examples of such advantages are described herein. Embodiments of the disclosure may improve operational performance for several types of transistors, such as HV EDMOS transistors. Field plate 210 may improve breakdown voltage, saturation-drain-current, and gate-drain capacitance in transistor structure 212.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing structures as part of either (a) an intermediate product, such as a motherboard, or (b) an end product. The end product can be any product that includes integrated circuit chips, ranging from toys and other low-end applications to advanced computer products having a display, a keyboard or other input structure, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A transistor structure, comprising:
   a field plate over a first dielectric layer, the field plate including:
      a first layer including a high dielectric constant metal gate (HKMG) stack, the HKMG stack including a work function metal (WFM) embedded within a high dielectric constant (high-K) material and a metal layer over an upper surface of the high-K material, and
      a second layer over the first layer; and
   a gate structure over the first dielectric layer and laterally adjacent to the field plate, the gate structure including:
      a polysilicon layer, and
      a gate spacer laterally between the polysilicon layer and the field plate.

2. The transistor structure of claim 1, wherein the gate structure does not include the HKMG stack, and wherein the second layer of the field plate includes polysilicon or amorphous silicon.

3. The transistor structure of claim 1, wherein the first dielectric layer further includes:
   a first portion over a doped well region including a first doped well and a second doped well, the first portion having a first height above the doped well region, and
   a second portion adjacent the first portion and over the second doped well, the second portion having a second height above the second doped well region greater than the first height,
   wherein the gate structure is over the first portion and the second portion, and the field plate is over the second portion.

4. The transistor structure of claim 3, wherein the gate structure further includes:
   a second dielectric layer vertically between the polysilicon layer and the first dielectric layer,
   wherein the gate spacer laterally separates the second dielectric layer and the field plate.

5. The transistor structure of claim 1, wherein the field plate is laterally distal to a complementary metal oxide semiconductor (CMOS) device and laterally distal to a flash memory cell structure.

6. A transistor structure, comprising:
   a field plate over a first dielectric layer, the field plate including:
      a first layer including a high dielectric constant metal gate (HKMG) stack, and
      a second layer over the first layer,
      a hard mask remnant vertically between the first layer and the first dielectric layer; and
   a gate structure over the first dielectric layer and laterally adjacent to the field plate, the gate structure including:
      a polysilicon layer, and
      a gate spacer laterally between the polysilicon layer and the field plate.

7. The transistor structure of claim 6, wherein the HKMG stack includes a work function metal (WFM) embedded within a high dielectric constant (high-K) material and a metal layer over an upper surface of the high-K material.

8. The transistor structure of claim 6, wherein the gate structure does not include the HKMG stack, and wherein the second layer of the field plate includes polysilicon or amorphous silicon.

9. The transistor structure of claim 6, wherein the first dielectric layer further includes:
   a first portion over a doped well region including a first doped well and a second doped well, the first portion having a first height above the doped well region, and
   a second portion adjacent the first portion and over the second doped well, the second portion having a second height above the second doped well region greater than the first height,
   wherein the gate structure is over the first portion and the second portion, and the field plate is over the second portion.

10. The transistor structure of claim 9, wherein the gate structure further includes:
    a second dielectric layer vertically between the polysilicon layer and the first dielectric layer,
    wherein the gate spacer laterally separates the second dielectric layer and the field plate.

11. The transistor structure of claim 6, wherein the field plate is laterally distal to a complementary metal oxide semiconductor (CMOS) device and laterally distal to a flash memory cell structure.

12. The transistor IC structure of claim 11, wherein the flash memory cell structure includes:
    a pair of word line gate structures including a first word line gate structure and a second word line gate structure, the pair of word line gate structures having a first height above a substrate;
    a pair of control gate structures including a first control gate structure and a second control gate structure, the pair of control gate structures laterally between the pair of word line gate structures and having a second height above the substrate less than the first height;
    a pair of gate spacers including a first gate spacer and a second gate spacer, the first gate spacer laterally between the first control gate structure and the first word line gate structure, and the second gate spacer laterally between the second control gate structure and second word line gate structure; and
    an erase gate structure laterally between the pair of control gate structures,
    wherein the field plate has a third height above the substrate greater than the first height.

13. The transistor IC structure of claim 12, wherein each of the pair of word line gate structures includes:
    a first layer including the HKMG stack, and
    a second layer over the first layer, the second layer including polysilicon.

14. The transistor structure of claim 12, wherein the pair of gate spacers of the flash memory cell structure and the gate spacer of the gate structure each includes a horizontally tapered end.

15. A method of forming a transistor structure, comprising:
- forming a field plate over a first dielectric layer, the field plate including:
  - a first layer including a high dielectric constant metal gate (HKMG) stack, the HKMG stack having a work function metal (WFM) embedded within a high dielectric constant (high-K) material and a metal layer over an upper surface of the high-K material, and
  - a second layer over the first layer; and
- forming a gate structure over the first dielectric layer and laterally adjacent to the field plate, the gate structure including:
  - a polysilicon layer, and
  - a gate spacer laterally between the polysilicon layer and the field plate.

16. The method of claim 15, wherein the second layer of the field plate includes polysilicon or amorphous silicon, and wherein the gate structure does not include the HKMG stack.

17. The method of claim 15, wherein forming the field plate over the first dielectric layer includes:
- forming a first portion of the first dielectric layer over a doped well region including a first doped well and a second doped well, the first portion having a first height above the doped well region, and
- forming a second portion of the first dielectric layer adjacent the first portion and over the second doped well, the second portion having a second height above the second doped well region greater than the first height.

18. The method of claim 17, wherein forming the field plate includes forming a hard mask remnant vertically between the first layer of the field plate and the second portion of the first dielectric layer.

19. The method of claim 17, wherein forming the gate structure includes forming a second dielectric layer vertically between the polysilicon layer and the first dielectric layer.

20. The method of claim 15, further comprising:
- forming a wordline gate structure within a flash memory cell structure simultaneously with the field plate; and
- forming a gate structure of a complementary metal oxide semiconductor (CMOS) device simultaneously with the field plate,
- wherein the field plate is laterally distal to the CMOS device and the wordline gate structure.

* * * * *